United States Patent [19]  [11] 4,038,580
Porret  [45] July 26, 1977

[54] ELECTRO-LUMINESCENT DIODE

[75] Inventor: Francis Porret, Hauterive, Switzerland

[73] Assignee: Centre Electronique Horloger S.A., Neuchatel, Switzerland

[21] Appl. No.: 607,922

[22] Filed: Aug. 26, 1975

[30] Foreign Application Priority Data

Sept. 5, 1974 Switzerland ............... 12082/74

[51] Int. Cl.² ............................................. H01J 1/02
[52] U.S. Cl. ...................................... 313/498; 357/17
[58] Field of Search ............... 313/498, 499, 500, 510; 357/17

[56] References Cited
U.S. PATENT DOCUMENTS

| 3,283,207 | 11/1966 | Klein | 357/17 X |
| 3,667,117 | 6/1972 | Kunz | 313/499 X |
| 3,774,021 | 11/1973 | Johnson | 313/499 X |
| 3,780,357 | 12/1973 | Haitz | 313/498 X |
| 3,813,587 | 5/1974 | Umeda et al. | 313/499 X |
| 3,876,900 | 4/1975 | Amatsuka et al. | 313/500 X |
| 3,936,855 | 2/1976 | Goell et al. | 357/17 |

Primary Examiner—James B. Mullins
Attorney, Agent, or Firm—Imirie, Smiley & Linn

[57] ABSTRACT

An electro-luminescent diode having a luminous surface which is defined by a thinned portion comprising zones with emitting junctions, the zones occupying only a portion of the luminous surface. The composition of the thinned portion allows multiple reflection of light to occur and enables light generated in the diode and totally internally reflected to be reflected back from a diffusing reflector to emerge and increase the intensity of light efficiency of the diode.

8 Claims, 8 Drawing Figures

ELECTRO-LUMINESCENT DIODE

BACKGROUND OF THE INVENTION

The present invention concerns an electro-luminescent diode, the luminous surface of which is defined by a thinned portion comprising zones having emitting junctions.

Electro-luminescent diodes are used for numerous display devices, for example, for: table calculators, measuring instruments or watches. In many cases their possibilities of use are limited by their insufficient efficiency.

The light produced by an electro-luminescent diode is, in general, created near (of the order of 1.5 $\mu$m) its plane luminous surface so as to reduce the absorption of emitted light. However, due to the high refractive index of the epitaxial material ($n = 3.5$ for the Ga (AsP)) used to produce such a diode, only the light produced in a cone having a small aperture (half angle at the apex $\simeq 16° = \sin^{-1}(1/3.5)$) can escape from the crystal, Most of the light is lost by total internal reflection in the crystal.

In the case of transparent crystals (Examples GaP (N), GaP(Zn,O)), some of the light which is normally lost, is recovered by the formation of mesa diodes, as that, for example, described in "Monolythic displays in GaP", N. E. Schumaker, Bell Labs. International Electron Devices Meeting 1973.

These diodes have the following disadvantages:

insufficient concentration of the light, losses of light throughout the crystal, deep mesa structure in which the interconnections and the use of domes are difficult.

There are other types of diodes for which the emission is subjected to strong crystalline absorption. This is the case, in general, with direct type radiative recombination crystals, such as $GaAs_{1-x}P_x$ ($x < 0.45$) and GaAs. The position is even more critical, because all the light which undergoes total internal reflection is absorbed in the crystal. Attempts have already been made to reduce the absorption according, for example, to a technique described in: "Improved Technique for the Preparation of $Ga_xAl_{1-x}As$ Electroluminescent Diodes", H. Beneking, Electronics Letters 8, 16, 13th January 1972.

The absorption of light issuing directly is reduced by these techniques, but most of the light remains in the crystal and is absorbed after total internal reflection at the surface.

In order to reduce simultaneously losses of absorption and total reflection on the surface, it has already been proposed to locate, above the junction, a transparent compound material, the surface of which is then worked to form domes. A structure of this type is described, for example, in: "Semiconductive alloy light source having improved optical transmissivity", S. V. Galginaitis, assignor to General Electric Company, U.S. Pat. No. 3,302,051, Jan. 31st 1967.

Although these structures are interesting, they have several disadvantages:

loss of light emitted outside the cone defined by the dome;

very high cost, because it is necessary to grow an epitaxial layer during a very long time, and moreover, the domes have to be shaped.

Finally, electroluminescent diodes are known from U.S. Pat. No. 3,703,670 (Kunz) comprising cylindrical junctions disposed perpendicularly relative to a thinned zone which reduces the absorption and comprising further a reflecting surface, serving also as electrode, to recover a small part of the light emitted in the wrong direction. The improvement in the luminosity of the diode is limited, whereas the emitted light is not homogeneous over the entire thinned zone forming, in fact, the luminous surface.

SUMMARY OF THE INVENTION

According to the present invention there is provided an electro-luminescent diode, having a luminous surface which is defined by a thinned portion comprising zones with emitting junctions, the said zones occupying only a portion of the said thinned portion, the composition of which is such as to reduce the absorption of the light, and being provided at its boundary surface with means for reflecting and diffusing the light to enable the light emitted within the diode to escape after multiple reflections in order to improve the luminous efficiency thereof.

BRIEF DESCRIPTION OF THE DRAWINGS

The present invention will be described further, by way of example, with reference to the accompanying drawings, in which.

DETAILED DESCRIPTION

Figure 1:
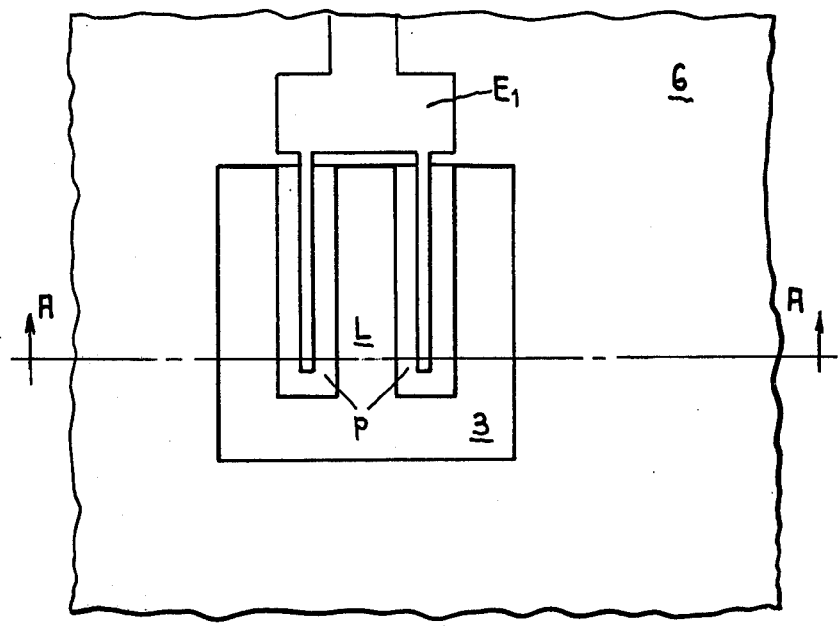
FIG. 1 is a top view of a diode of variable composition for display, using integrated electro-luminescent diodes according to the present invention.
Figure 2:
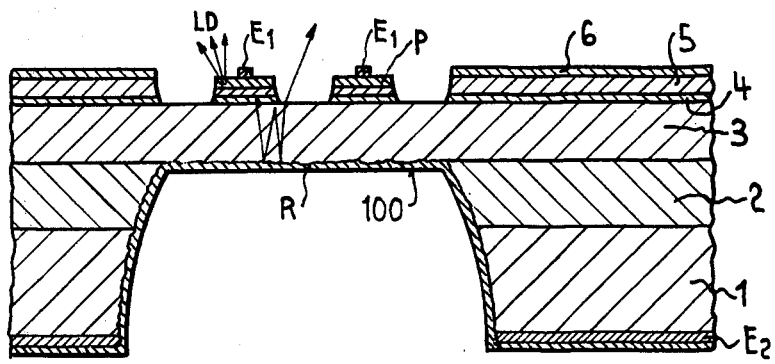
FIG. 2 is a sectional view taken on the line A—A of the diode shown in FIG. 1.

A first embodiment of the present invention is shown in FIGS. 1 and 2, which may be particularly well applied to electro-luminescent diodes formed of a material having direct radiative transitions such as $GaAs_{1-x}P_x$ ($x \leq 0.45$), epitaxially grown on a substrate such as GaAs by which it is possible to get variable compositions.

The direct type radiative recombination materials have, similar to $GaAs_{1-x}P_x$ ($x \leq 0.45$), a strong absorption for the short wavelength emission due to the fundamental absorption of the crystal. For example, the coefficient of absorption $\alpha$ of $GaAs_{0.6}P_{0.4}$ is approximately 3000 cm$^{-1}$ for a wavelength corresponding to the emission peak.

In order to avoid losses due to this strong absorption, three means are simultaneously employed in this first embodiment. The first consists in reducing the thickness of the substrate of the crystal under the zone comprising the emitting function, the part of reduced thickness thus defining the luminous surface. The second means consists of making this thinner part transparent to the light emitted by the junctions, as far as the level of said junctions, by modifying the composition of the crystal in the course of the epitaxy. The third means consists of limiting the surface of the emitting junctions to only one part of the luminous surface, by removing material in the vicinity of the junction as far as the transparent zone, thus permitting the rays emitted downward in FIG. 2 to be reflected and to leave the crystal from the luminous surface with a minimum absorption. Moreover, a diffusing reflector base R is selected, which increases the probability of the reflected ray to leave the crystal. This base R is spaced approximately at a distance of 15 to 40 $\mu$m from the emitting junction, in recesses formed by thinning the crystal under the luminous part L of the electro-luminescent diodes. These recesses are obtained by selective and monitored chemical etching. The diffusing properties are improved by sanding the surfaces of the recess and then by metallizing them.

Experiments have shown that the thickness-to-width ratio of the thinned down zone must be of the order of one tenth. In the embodiment given, the variable composition structure comprises substantially the following zones (FIG. 2):

A substrate 1 of GaAs having an n-type electron conductivity.

A first transition layer 2 (thickness 50 $\mu$m, approximately) in which the composition $x$ of the epitaxial layer increases from $x = 0$ to $x = x_2$, this zone of increase making it possible to achieve a transparent composition from the GaAs substrate.

A transparent zone 3 (thickness from 15 to 40 $\mu$m, approximately) of $GaAs_{1-x_2}P_{x_2}$ having a fixed composition $x_2$.

A second transition layer 4 (thickness 1.5 $\mu$m, approximately) having a composition decreasing from $x_2$ to $x_1$ permitting the passage between the zone 3 and a zone 5.

A zone 5 (thickness 7 $\mu$m, approximately) $GaAs_{1-x_1}P_{x_1}$ having a fixed composition $x_1$ in which the p zones of the p-n emitting junctions are created by subsequent diffusion of an acceptor such as Zn in a quartz capsule.

The epitaxial zones 2 to 5 are n doped in the course of growth by means of a donor such as Se or Te.

The various chemical compositions required in the above-mentioned structure are obtained and controlled in a reproduceable way by means of a vapor phase epitaxy method described in:

"The Preparation and Properties of Vapor-Deposited Epitaxial $GaAs_{1-x}P_x$ Using Arsine and Phosphine", J. J. Tietjen and J. A. Amick, Journal of the Electrochemical Society 113, 724, 1966.

In order to obtain the required compositions, it is only necessary to adjust the quantity and the ratio of $PH_3$ and $AsH_3$ gases entering the reaction chamber. Since the value of the forbidden band $E_{gap}$ of the compound $GaAs_{1-x}P_x$ compound increases as a function of $x$, it is still possible to get the difference $E_{gapx_2} - E_{gapx_1}$ to be as large as the width of the emission band of zone 5, a feature which makes zone 3 transparent to the light emitted by the junctions situated in zone 5.

After the growth of the variable composition epitaxial layer Ga(AsP), an insulating layer 6 of silicone-nitride $(Si_3N_4)$ is deposited on the zone 5 (in vapor phase). Windows L are opened in this insulating layer by the conventional photolitographic method, using a mask of pyrolithic $SiO_2$ (Vapox) and locally etching the silicone-nitride. The insulating layer 6 serves, on the one hand, as a diffusion mask and, on the other hand, as an electrically insulating layer between the crystal and the electrode and the interconnection $E_1$ outside the window L in FIG. 1.

The diffusion of p zones through the windows L in the zone 5 of the n-type crystal is obtained by placing the epitaxial wafer, accompanied by a source of Zn and As under vacuum in a quartz capsule. The diffusion then takes place for 15 hours at 650° C. This diffusion technique is normally used in the industrial manufacture of electro-luminescent diodes of Ga(AsP) type. It produces a diffusion extending from the surface to a depth $x_j$ of 1.7 $\mu$m approximately. The wafers are then ground and polished.

A pyrolithic film of $SiO_2$ (thickness of approximately 4000 A) is deposited in a vapor phase, in which the windows are opened by means of the photogravure technique to produce an etching mask permitting narrowing the formation of the thinned portions 100 of a wafer under the junctions which have just been diffused.

The alignment of the apertures of the mask with the epitaxial plate is effected by means of a microscope provided with a visible to infra red convertor, the substrate of GaAs being opaque to the visible light.

The opening of the apertures in the $SiO_2$ is effected by means of BHF (buffered HF), while the etching of the GaAs-Ga (AsP) is carried out by a bath of 1:$H_2O$, 1:$H_2SO_4$, 8:$H_2O_2$ permitting uniform etching.

The recess 100 under the junctions is monitored by microscopic observation. This makes it possible to stop the etching when predetermined thickness of the material is reached.

After etching, the underside of the thinned portion is made diffusing by sanding the back of the plate by means of an air jet containing $Al_2O_3$ (5 $\mu$m) powder, the remaining layer of $SiO_2$ is removed in a bath of BHF.

The plate is then metallized by the conventional method used in Ga(AsP) technology to form the ohmic contacts. A layer of Au-Sn of 4000 A is evaporated on the $n$ side and a layer of Al of 10,000 A on the $p$ side. Before being alloyed by heat treatment for 10 minutes at 470° C, these layers are engraved to define the upper electrode $E_1$ with its ohmic contact extensions and the common electrode $E_2$ around the recess 100.

The Au-Sn is then removed as reflecting metal from the recessed parts, because its efficiency is reduced by the fact that it is then alloyed to form an ohmic contact. A second evaporation of an Au or Al layer of 5000 A is performed on the back of the epitaxial wafer to improve the characteristics of the reflector.

By means of a final photogravure process, the localised recombination zones within the openings L are finally defined, the etching of the epitaxial material $GaAs_{1-x_1}P_{x_1}$ (type p and n) being effected by means of a bath of 9:$H_2SO_4$ (75%), 1:$H_2O_2$.

The thickness of 7 $\mu$m approximately, of the zone 5 of fixed composition $x_1$ is necessary for removing the radiative recombination zones of the numerous dislocations produced in the vicinity of the second transition layer 4. Without this precaution, the diodes would undergo an appreciable drop in their internal efficiency.

If zone 5 with its layer p were preserved over the entire thinned zone, its absorption would greatly limit the path which a luminous ray can take in this zone and also its chance of leaving. This is the reason why a large part of the surface occupied by zones 4 and 5 on the thinned zone is removed by chemical etching, a feature which creates the zones of reduced radiative recombinations around which the light can emerge by multi-reflections in the thinned zone.

Figure 4:
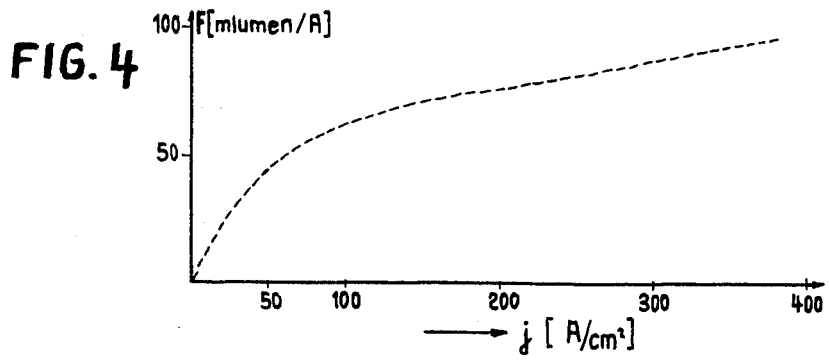
FIG. 4 is a diagram showing luminous efficiency as a function of the current density.

A further advantage which may be obtained from the reduction of the recombination zones is bound up with the fact that the electro-optical efficiency of the electro-luminescent diodes increases in general as a function of the density of the injected current. This is illustrated by the diagram in FIG. 4 in which the luminous efficiency F of a diode with $GaAs_{0.6}P_{0.4}$ is ploted as a function of its current density $j$. The luminous efficiency F, i.e., the luminous flux emitted per unit of injected current is proportional to the efficiency of a diode. The measurements have been made using pulsed currents to avoid any heating.

In the embodiment shown in FIGS. 1 and 2, recombination zones are illustrated, the total surface of which represents one-fourth of the luminous surface L. For any given diode current, an increase by 4 is therefore obtained in the current density, a feature which involves an increase by at least 50% of the internal efficiency, and an increase of the brightness of its luminous surface; consequently, the contrast of the display is improved.

For a display of a given brightness, this increase in efficiency may be used to reduce the intensity of the current, hence a reduction in the consumption of the display as well as the surfaces of the semiconductor elements controlling the decoder of the display.

From the theoretical point of view, the progressive increase in the inner efficiency for increasing current densities may be explained by progressive filling of the donor band, leading to the inversion of the populations, the latter being achieved only for laser conditions. The fact that the levels of energy are filled above the level corresponding to thermal equilibrium has the effect of increasing the probability of radiative recombination and reducing the re-absorption.

The diffusing reflector base represents an important component in the structure. It ensures isotropic redistribution of the incident light beam, that is to say, an incident ray has the same probability of being reflected in any direction.

Figure 3:
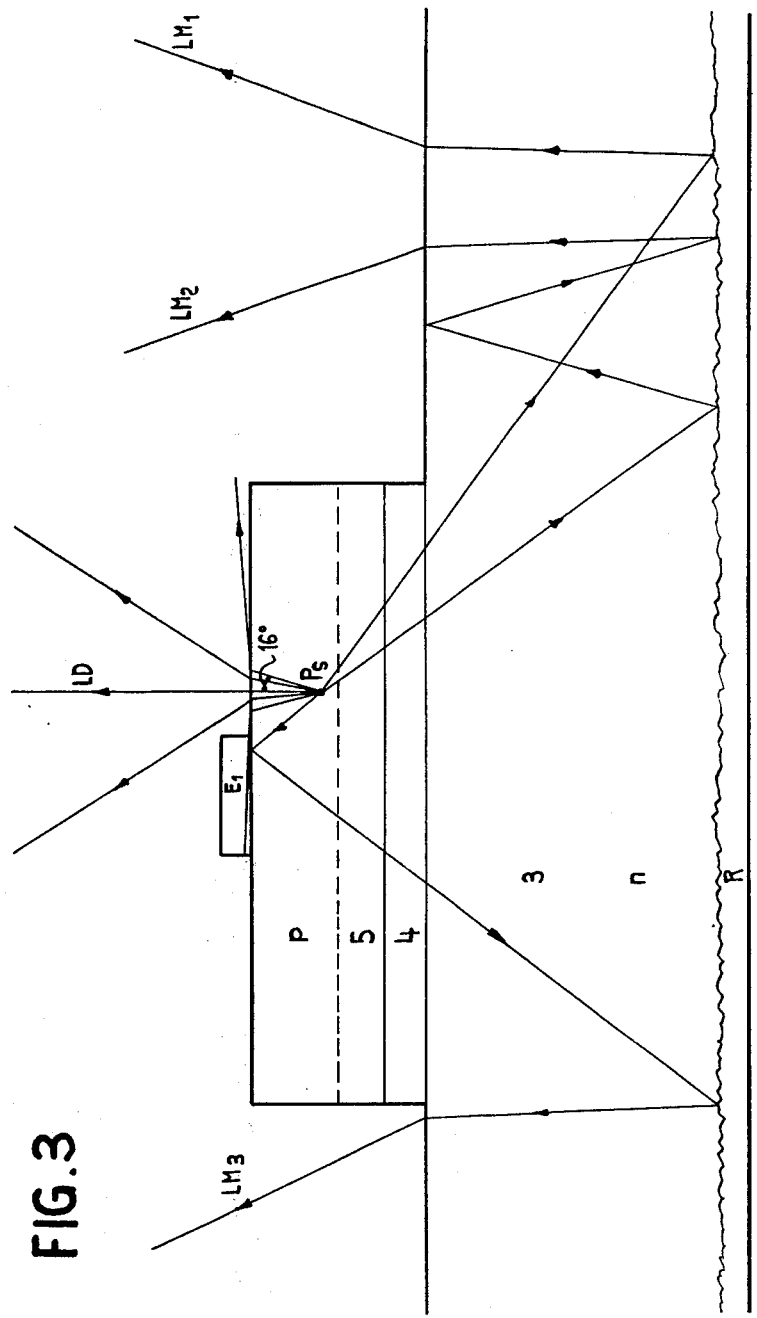
FIG. 3 is a diagram explaining the part played by multi-reflections.

Various possibilities of extracting light are given by way of example in FIGS. 2 and 3, FIG. 3 showing an enlarged portion of the thinned zone of FIG. 2. The LD (direct light) rays shown issuing from a source point $P_s$ characterise the normal emission of an electro-luminescent diode, that is to say, the one subjected to the refraction of the p-air zone interface and emerging in a cone of restricted angle ($\theta/2 = 16°$ for Ga(AsP)). The LM rays are examples of the extraction of multi-reflected light.

FIG. 3 shows three particular multi-reflected rays: $LM_1$, issuing from the source point, is reflected by the diffusing reflector base R at a favorable angle and emerges directly, because it is in the output cone. $LM_2$, also starting from the source point, is reflected firstly at an angle greater than $\theta/2 = 16°$ by the reflector R. It therefore undergoes total internal reflection on the crystal-air interface and falls a second time on the diffusing reflector base R which this time imparts to it the correct direction to get out of the crystal, $LM_3$ represents a case in which the light which first goes upward, is subjected to a total internal reflection on the surface and leaves, after reflection on the base R, at a favorable angle. If the absorption of the narrow layer is poor, the ray may carry out, with very few losses, several reflections between the surface of the crystal and the base R. This considerably increases its chance of escape, that is to say, the capacity of the structure to exact light.

A simple formula enables the gain obtained by the multi-reflections to be expressed. It originates from a model of a simplified structure where a zone of thickness $d$ is characterized by an average absorption coefficient $\alpha$, an isotropic diffusion and a reflectivity equal to the unit for the base R.

The gain of such a structure for which $\alpha d$ is finite ($o < \alpha d < \infty$) relative to a structure, not assisted by multi-reflections ($\alpha d = \infty$) is given by the ratio of the external efficiency of the two structures:

$$\frac{n_{ext}(\alpha d \neq \infty)}{n_{ext}(\alpha d = \infty)} = \frac{1}{1 - (1 - (n_o/2n_1)^2) \exp(-2\alpha d)}$$

in which $n_o$, $n_1$ are the refractive indexes of the air and of the thinned zone of the crystal, respectively.

This formula shows that, as $\alpha d$ tends towards zero, that is to say, as the absorption of the thinned zone tends towards zero, or its transparancy towards the unity, the gain tends towards $(2n_1/n_o)^2$, i.e., a potential gain of 49 for a crystal of Ga(AsP) for which $n_1 = 3.5$.

One method of reducing $\alpha d$ is to thin the layer, and another method is to reduce $\alpha$. For a structure constituted by N superposed zones:

$$\alpha = \frac{1}{d} \sum_{1}^{N} \alpha_i d_i$$

in which $\alpha_i$ and $d_i$ are the coefficient of absorption and the thickness of the zone $i$ respectively. Hence, by making a portion of the layer transparent, the mean value of coefficient $\alpha$ is lowered.

Figure 5:
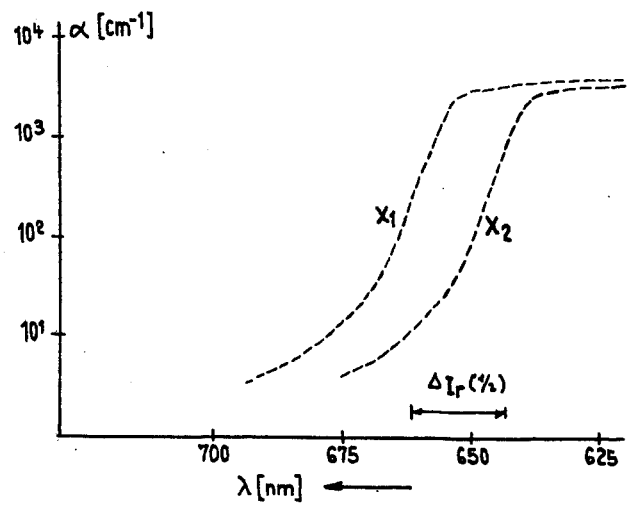
FIG. 5 is a diagram showing absorption as a function of wavelength.

This possibility is illustrated in FIG. 5 which shows the absorption coefficients $\alpha$ as a function of the wavelength $\lambda$ associated with two compositions $x_1 = 0.40$ and $x_2 = 0.42$ of n-type doped $GaAs_{1-x}P_x$, ($n = 1.2 \times 10^{17} cm^{-3}$).

By producing, as described above and illustrated in FIGS. 2 and 3, a zone of composition $x_2$ under a zone of composition $x_1$ (with $x_2 > X_1$), it is possible to greatly increase the transparency of the zone $x_2$ ($\alpha_2 << \alpha_1$) for the emission produced by the p/n junction located in the zone of composition $x_1$. This emission is indicated in FIG. 5 by the bandwidth $\Delta$ $I_r(\frac{1}{2})$ measured at half the maximum radiative intensity of the electro-luminescence $I_r$ in mW by steradian. This emission peaks on $\lambda_{EL} = 652.5$ nm and at this wavelength has a coefficient of absorption at least 250 times less for the composition $x_2$ than for the composition $x_1$.

Figure 6:
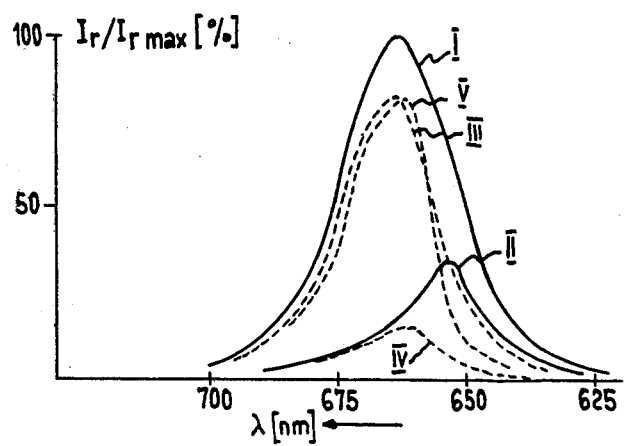
FIG. 6 is a diagram showing radiation intensity as a function of wavelength.

FIG. 6 illustrates the operation of the overall system by diagram in which the mean intensity of electroluminescence $I_r/I_{rmax}$ is shown as a function of wavelength $\lambda$ in various cases, to show the advantage of a structure having all the characteristics stated above.

$I_r/I_{r\,max}$ is indicated for the following cases:
I. Thinned down electro-luminescent diode.
II. Unthinned down electro-luminescent diode.
III. Difference between I and II.
IV. II after absorption on 7 $\mu$m of material of composition $x_1$.
V. IV multiplied by the gain due to multi-reflections.

The graphs I and II show the intensity of emission measured for a diode made thinner to 25 $\mu$m under the radiative recombination zones and for another diode not made thinner. Both have luminous surfaces of the same dimensions. The gain obtained by the proposed structure is evident. It is close to a factor 4.

The graphs III, IV, V make it possible to check whether this gain does come from the extraction of light by multi-reflection. Since graph III is the difference between the measured graphs I and II, it corresponds to the quantity of light extracted by multi-reflection from the thinned diode. If such is the case, this quantity of light may also be calculated from II by bearing in mind that the emission from the junction in the direction of the diffusing reflector base is partly absorbed in the zone of composition $x_1$ having thickness of 7 μm (graph IV) before being extracted by multi-reflections according to the description which has been given and in accordance with the formula given above (graph V). Agreement between graphs V and III being excellent, the gain in emission by 4 of I compared with II is therefore due to the desired extraction of light by multi-reflections.

The luminous efficiency F expressed in mlumen/A takes into account the spectral response of the eye. This is the value better adapted than the radiative intensity $I_r$ for comparing the electro luminescence of the diodes of a display. Expressed in mlumen/A, the gain shown in FIG. 6 is reduced to a value of approximately 2.5 due to the fact that the eye is less sensitive to the range of wavelength shown in curve I, FIG. 6, compared with curve II, FIG. 6.

As shown by the sequence of graphs II, IV and V, the displacement of I = II + V relatively to II towards the longer wavelengths is due to the fact that the light, before being multi-reflected, is absorbed by the zone 5 of composition $x_1$. The thickness of this zone makes it possible to remove the p/n junctions from the transition layer 4 having a decreasing composition. As explained above, this precaution is necessary in Ga(AsP) technology, because the lattice of the compositions $x_1$ and $x_2$ are different and the passage from one to the other introduces dislocations.

The use of another material, such as $Al_xGa_{1-x}As$, for which a sudden change of composition is possible without the creation of dislocations, makes it possible to reduce the thickness of zone 5 in FIG. 2 to approximately 2 μm, that is to say to a distance slightly greater than the depth of diffusion $x_j$. This reduces the absorption of the structure, increases its gain and avoids the displacement of graph I relatively to II.

In this case, the structure proposed for the extraction of light by multi-reflections is similar to that in FIG. 2, except for the transition layers 2 and 4, the thicknesses of which may be made zero.

A second variant is the use of an epitaxial material such as $GaAs_{1-x}P_x(N)$ for which the emission band is sufficiently removed from the basic absorption of the crystal.

Figure 7:
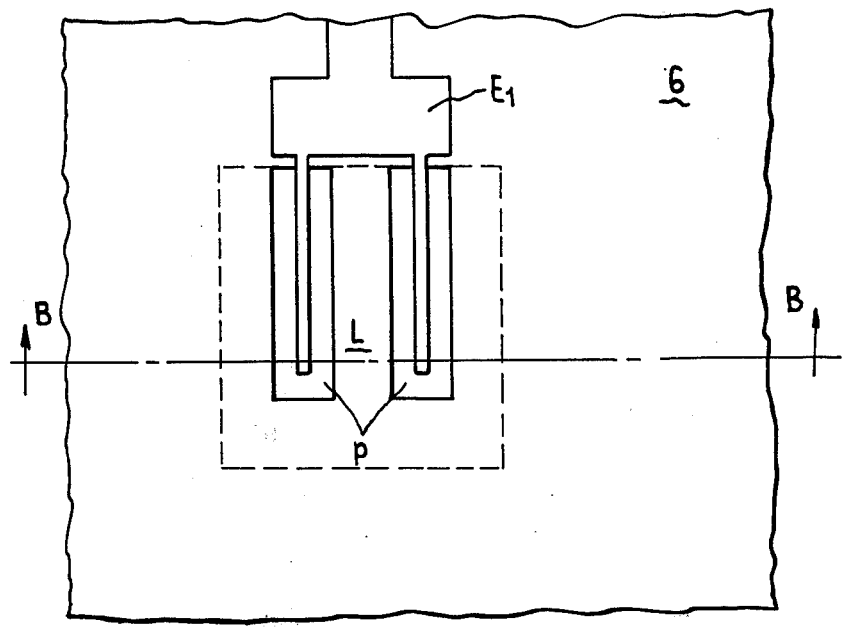
FIG. 7 is a top view of a diode in which the diffused zones occupy only a fraction of the luminous surface according to the present invention.
Figure 8:
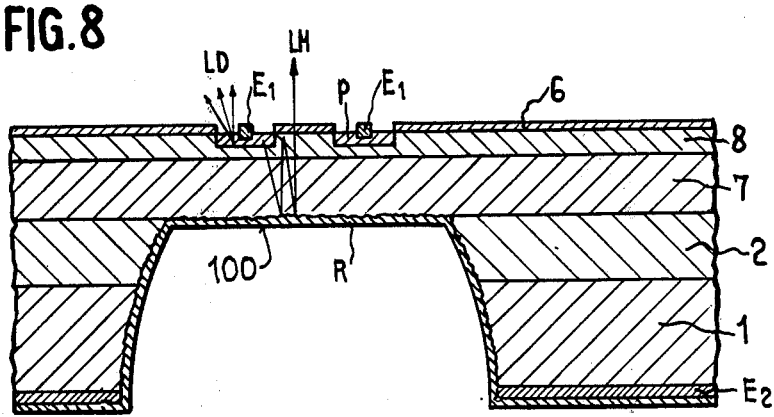
FIG. 8 is a sectional view, taken on the line B—B, of the diode shown in FIG. 7.

For example, a composition $x_1 = 0.6$ is of indirect type. Strongly doped with nitrogen, its emission is effected by means of nitrogen atoms the energy levels of which are localised within the forbidden band. The energy of the emitted light is therefore weaker than that corresponding to the basic absorption band of the crystal. A considerable reduction of absorption occurs. In such a case, a structure having a double composition $x_1$ and $x_2$ is no longer necessary and the structure proposed for the extraction of light by multi-reflections is shown in FIGS. 7 and 8.

In these Figures, the reference are the same for similar parts as in FIGS. 1 and 2. They show in particular:

the GaAs(or GaP) substrate 1 which has n-type electronic conductivity, a single transition layer 2 (thickness approximately 50 μm) the composition x of which varies from $x = 0$ (substrate GaAS) or $x = 1$ (substrate GaP) to $x = x_1$ which makes it possible to achieve the desired composition $x_1$, a transparent zone 7 (thickness 15 to 40 μm approximately) of $GaAs_{1-x_1}P_{x_1}$ of fixed composition $x_1$, a zone 8 (thickness approximately 5 to 10 μm of $GaAs_{1-x_1}P_{x_1}$ (N), strongly doped with nitrogen in the course of growth in which the p-zones of the emitting junctions are diffused.

The epitaxial zones 2, 7 and 8 are n doped in the course of growth by means of a donor such as Se or Te.

As described above, the different chemical compositions required are obtained and controlled by adjusting the quantity and the ratio of $PH_3$ and $AsH_3$ entering the reactor in the course of epitaxy. The N doping is obtained by controlling the input of $H_2Se$ or $(C_2H_5)_2Te$ gas diluted in a flow of hydrogen, the final doping is done by introducing $NH_3$ at the end of the epitaxy.

After growth, a layer of silicone-nitride 6 is deposited on zone 8, and diffusion windows p are opened by photogravure. These windows are of reduced dimensions relatively to the subsequently thinned zone of the crystal in order to minimize the absorption of the multi-reflected rays by the diffused zones p.

The following operations are the same as for the first embodiment: the diffusions of the zones p in capsules, the thinning of the crystal and, if desired, including a portion of zone 7 of composition $x_1$, the etching of the diffusing base, the metallisations and the photogravure process of the electrodes $E_1$ and $E_2$.

This variant has an excellent capacity for the extraction of luminous rays by multi-reflections, because it combines the transparency of zone 7 with weak absorption of zone 8 with the emission produced by the junctions of the latter. The emitted rays can thus be reflected between the luminous surface L and the diffusing reflector base R several times before being absorbed, a feature which greatly increases their probability of emergence in accordance with the explanations given above.

A modification of this variant may yield a further gain in the extraction of the light which concerns elimination of zone 8 around the p/n junctions by chemical etching. This etching is effected according to the process given in the first variant for engraving localised recombination zones.

It is apparent from the general description that the main advantages of the proposed structure are as follows:

a. the efficiency of an electro-luminescent diode may be greatly increased by the provision of radiative recombination zones of reduced dimensions located on a thinned portion of the crystal having weak absorption, provided with a diffusing reflector base, thus assisting the extraction of light by increasing the probability of the emitted and multi-reflected rays in the structure emerging therefrom, and locating and defining the extent of the luminous surface, b. the zones of localised recombinations makes it possible to operate with stronger current densities (confinement) for the same diode current means, a feature which increases the efficiency of electro-optical conversion of the radiative zones, the only limitations being heating, the increase of leak currents of very small geometries and the life time of the diodes, c. the provision of recombination zones of reduced dimensions makes it possible to free a large part of the luminous surface from the absorption produced by the diffused zone and by the excessively absorbent surface layers, thus enabling multi-reflections to occur, d. the thinning of the crystal assists luminous extraction in the immediate vicinity of the radiative recombination zones and produces better localisation and concentration of the light around these zones; and e. the diffusing reflector base gives rays emitted in any direction the increased probability of being reflected in a direction which enables them to leave the crystals.

I claim:

1. An electro-luminescent diode, comprising a body having a luminous surface which is defined by a thinned portion of said body, said surface including zones with light emitting junctions, said zones occupying only a portion of said thinned portion, the composition of said thinned portion being varied such that a lower absorption of the emitted light is exhibited outside said zones than within said zones, and said thinned portion including reflector means on the back surface of said thinned portion to enable recovery, by multiple reflection, of the light emitted within the diode to improve the luminous efficiency thereof.

2. An electro-luminescent diode according to claim 1, wherein the thickness-to-width ratio of the said thinned portion is of the order of one to ten.

3. An electro-luminescent diode according to claim 1, wherein the said zones occupy approximately one-fourth of the said thinned portion.

4. An electro-luminescent diode according to claim 1, wherein said luminous surface comprises a substratum with n-type conductivity, at least one zone of radiative recombination, a zone of smaller absorption to the emitted light than said recombination zone comprising a transparent zone and at least one transition layer between said transparent zone and said substratum.

5. An electro-luminescent diode according to claim 4, wherein the material of said transition layer is a compound of $GaAs_{1-x}P_x$, in which $x$ varies between $x=0$ in the substratum GaAs and $x=x_1$ in the recombination zone and $x=x_2$ in the transparent zone, respectively.

6. An electro-luminescent diode according to claim 4, wherein the material of said transistion layer is a compound of $GaAs_{1-x}P_x$, in which $x$ varies between $x=1$ in the substratum GaP and $x=x_1$ in the recombination zone and $x=x_2$ in the transparent zone, respectively.

7. An electro-luminescent diode according to claim 1, wherein said zones with light emitting junctions are composed of strongly nitrogen doped GaAsP.

8. A method for producing an electro-luminescent diode according to claim 1 comprising forming said thinned portion by selective chemical etching, and forming said reflector means by sanding and metallizing the back surface of said thinned portion.

* * * * *